(12) United States Patent
Girg et al.

(10) Patent No.: US 7,490,715 B2
(45) Date of Patent: Feb. 17, 2009

(54) LINK CHAIN WITH IMPROVED WEAR RESISTANCE AND METHOD OF MANUFACTURING SAME

(75) Inventors: Helmut Girg, Eurasburg (DE); Martin Kohn, Miesbach (DE); Stefan Pintoiu, München (DE); Stephan Schmitt, München (DE); Gerald Jörgensen, Fürstenfeldbruck (DE); Bernhard Schachtner, Johanneskirchen (DE)

(73) Assignee: Joh. Winklhofer & Soehne GmbH & Co. KG, Munich (DE)

( * ) Notice: Subject to any disclaimer, the term of this patent is extended or adjusted under 35 U.S.C. 154(b) by 169 days.

(21) Appl. No.: 11/372,568

(22) Filed: Mar. 10, 2006

(65) Prior Publication Data

US 2006/0217224 A1    Sep. 28, 2006

(30) Foreign Application Priority Data

Mar. 11, 2005  (DE)  ........................ 10 2005 011 705

(51) Int. Cl.
*B65G 17/38*    (2006.01)
(52) U.S. Cl. ............................. 198/853; 198/850; 59/4; 59/5; 148/319
(58) Field of Classification Search ......... 198/850–853; 148/319; 59/4, 5, 8, 35.1; 474/206, 207
See application file for complete search history.

(56) References Cited

U.S. PATENT DOCUMENTS

| 1,551,764 | A | 9/1925 | Müller | |
|---|---|---|---|---|
| 3,891,474 | A | 6/1975 | Grange | ....................... 148/16.5 |
| 4,119,443 | A | 10/1978 | Abe et al. | ................... 148/12.1 |
| 4,415,378 | A | 11/1983 | McKinney et al. | ......... 148/12.1 |
| 4,670,172 | A | 6/1987 | Sproul et al. | ................ 252/49.3 |
| 4,946,747 | A | 8/1990 | Bergmann et al. | ........... 428/653 |
| 5,865,021 | A | * 2/1999 | Duerigen et al. | .................. 59/4 |
| 5,865,699 | A | 2/1999 | Leini | ........................... 474/161 |
| 6,068,568 | A | * 5/2000 | Kozakura et al. | ............ 474/212 |
| 6,235,128 | B1 | 5/2001 | Chang et al. | ................. 148/219 |
| 6,490,853 | B1 | 12/2002 | Winklhofer et al. | .............. 59/7 |
| 6,539,699 | B2 | * 4/2003 | Poiret et al. | ....................... 59/5 |
| 6,666,013 | B2 | * 12/2003 | Nakagawa et al. | ................ 59/5 |
| 6,810,654 | B2 | 11/2004 | Bekiroglu | .................... 59/35.1 |
| 7,063,207 | B2 | * 6/2006 | Sykora | ........................ 198/853 |
| 2004/0018905 | A1 | 1/2004 | Okabe et al. | ................. 474/231 |

FOREIGN PATENT DOCUMENTS

| DE | 830247 | 2/1952 |
|---|---|---|
| DE | 1752557 | 5/1970 |
| DE | 3311696 | 3/1983 |
| DE | 9315150 | 2/1995 |
| DE | 19836374 | 8/1998 |

(Continued)

*Primary Examiner*—James R Bidwell
(74) *Attorney, Agent, or Firm*—Baker Botts L.L.P.

(57) ABSTRACT

Link chain with improved wear resistance as well as method of manufacturing such a link chain. For manufacturing of a link chain, several chain links (39; 40) comprising link pins (41) or plates provided with coatings being applied by means of a PVD process are assembled. The coatings consist of hard material layers and/or slide material layers. It is possible that no PVD coating is provided on a transition zone (1*a;* 4) of elements (41; 42) used for the manufacturing of the chain links predetermined for connection with another element (42; 41).

9 Claims, 3 Drawing Sheets

FOREIGN PATENT DOCUMENTS

| | | |
|---|---|---|
| DE | 19822928 | 11/1999 |
| DE | 10033726 | 7/2000 |
| DE | 10311915 | 10/2003 |
| DE | 10326710 | 2/2004 |
| DE | 20304437 | 7/2004 |
| EP | 0288677 | 11/1988 |
| GB | 2314604 | 1/1998 |

* cited by examiner

LINK CHAIN WITH IMPROVED WEAR RESISTANCE AND METHOD OF MANUFACTURING SAME

PRIORITY

This application claims priority from German Patent Application No. DE 10 2005 011 705.8, which was filed on Mar. 11, 2005, and is incorporated herein by reference in its entirety.

TECHNICAL FIELD

The invention concerns a link chain in which chain links are connected to each other via pins.

BACKGROUND

Link chains are disclosed in DE 198 36 374 C1, in DE 100 33 726 C1 and in DE 1 752 557 AI. In addition, DE 203 04 437 U1 shows a link chain where the inside of an aperture is provided with a coating in order to receive a stud bolt.

U.S. Pat. No. 6,666,013 B2 discloses a chain where at least a portion of the chain, for example a surface, is coated with DLC (diamond-like carbon) with preferably metal particles being formed in the DLC hard material layer. The disadvantage of such a coating is that the DLC layer has to be applied by means of a CVD process where the amorphous carbon for the DLC layer is deposited from a chemical gaseous phase out of hydrocarbon ions reacting with fixed carbon. In this process, however, hydrogen is formed, so that it cannot be excluded that the hydrogen released by the hydrocarbon ions in the CVD process may cause a hydrogen embrittlement in the chain material. Moreover, such a CVD process requires a compact and expensive process and plant engineering and has therefore, not proven itself successful in practice for the finishing of chain links.

SUMMARY

It is the aim of the invention to further improve durability of the known link chains and reduce their noise development and to use a coating process and/or coating sequence for it which protect the elements of a link chain against hydrogen embrittlement.

This is solved by the subject matter of the independent claims. Advantageous further developments result from the dependent claims.

According to the invention, a chain pin of a link chain, especially in the area of its surface includes a PVD applied coating of at least a hard material layer with at least a material from the group AlN, AlON, CrN, CrCN, CrC, WC, WCN, TiN, TiBN, TiCN, TiC, TiAlN, ZrN, VC, cubic boron nitride or boron carbide suitable to be used in a PVD process. Thickness D of the PVD coating from a hard material layer is preferably 1 $\mu m \leq D \leq 10$ $\mu m$ with the hard material layer having one or several layers. Moreover, it may have variable stoichiometry.

Such a PVD applied coating presents the advantage that the risk of a hydrogen embrittlement is excluded, since the non-coated element neither comes into contact with water as in electroplating or laminating nor with hydrogen ions as in the CVD process. Moreover, a hard material coating with such a material has the advantage of high affinity to CrNi steel thus reducing the risk of chip off or abrading of the coating from the coated element of a link chain which fact is connected to high service life. Finally, with a thickness D of 1 $\mu m \leq D \leq 10$ $\mu m$ excellent fit and tolerances as well as high wear resistance for the coated surfaces of the elements are produced.

The term PVD process (abbreviation for physical vapour deposition) designates all methods of physical deposition of thin layers via the vapour phase).

In this process, the basic material for the layers is converted into the vapour phase in high-vacuum via the physical actions of vaporization (with arc, with ion beam or electron beam) or cathode sputtering and subsequently precipitated again on a suitable substrate. The layer thicknesses produced vary between 1 $\mu m$ and 15 $\mu m$ maximum.

In a typical embodiment of the invention, these are nitride hard material layers, i.e. compounds from the transition metals titanium or chromium with nitrogen. But also non-nitride hard material layers such as for example tungsten carbide are possible as hard material layer. Extended properties are furnished by hard material layers containing aluminum and carbon in addition.

The invention proceeds from the findings that wear resistance of state of the art link chains can be improved particularly well, if on the pin outside of a chain link, which normally connects two or more plates with each other, a uniform thin layer of a hard material is applied which can be deposited by means of a PVD process (Plasma Vapour Deposition).

According to the invention, the pin may be formed as a solid pin and/or link pin, as a sleeve, as a hollow pin or as a bushing.

Advantageously, the PVD layer is provided within a transition zone between pin and plate. This is particularly beneficial to chain links where the pins are received and retained in the plates by means of a press fit. This is attributed to the fact that manufacturing tolerances in the event of thin material layers applied according to the invention can be kept so small in a simple and economical way that the preloads caused by the joining of plate and pin are far smaller than is the case, for example when chromising chain link elements. Chromising of metals, for example, is described in U.S. Pat. No. 4,670,172.

Contrary to chain elements chromised wet-chemically by means of dipping or spraying methods in accordance with the state of the art, professionally manufactured and finished PVD coated chain elements are characterized by a surface roughness which is lower by approximately a factor 10.

On the contrary, for a known chromised link pin, the diameter may vary in the joining area by up to 20 $\mu m$. If on the other side the plate aperture for accommodation of the link pin is now at the lower limit of the manufacturing tolerance, a very thick link pin is joined with a very narrow plate aperture resulting in great preloads. In the event of additional load on the link chain produced with it, precisely the weakest link, namely the plate, is loaded in addition in the joining location which may lead to tearing in this preloaded location.

As a side effect of the PVD applied coating of the chain pin a very precise chain pitch results so that individual elongations are considerably reduced when the link chain is unwound on a chain drive. Already very little improvement with respect to an admissible variation of the chain pitch will result in a distinct improvement of wear resistance.

The inventive coating is performed selectively in certain locations of the chainpin. Contrary to other processes such as, for example, chromising, the PVD process, especially for chain elements, offers the possibility of excluding certain areas from coating.

Thus, it may be advantageous not to provide an additional PVD-coating in a transition zone between pin and plate. The manufacturing tolerances after manufacture of the pins are maintained there despite coating of the remaining surface areas of the pins which modifies surface roughness and diameter. Detrimental preloads in the area of the plate aperture are thus avoided.

In another embodiment of the invention, a slide material layer is placed. As slide material layers, for example Sn, Pb, In, their alloys or MoS, WS, or polymer layers such as polytetrafluor ethylene are provided. For this purpose, initially the hard material layer is deposited on the chain pin of the link chain by means of the PVD process and subsequently the slide material layer is placed onto the hard material layer. This presents the advantage that the material of the link chain element is protected by a "dry" PVD coating process such that subsequently even by eventual slide material layers applied by electroplating, hydrogen embrittlement is excluded since the element surfaces are protected by the hard material layer being applied by a "dry" process.

A hard material and slide material layer combination represents the advantage that the hard material layer directly on the surface of the element concerned provides long service lives for the link chain with the softer slide material layer being provided for good sliding properties. Such elements provide good internal frictional properties of the link chain, especially during running-up times such as in motor testing after motor assembly, when motor oil lubrication has not yet been build up. In this connection a layer thickness preferably in the range of $0.2\ \mu m \leq d \leq 20\ \mu m$ is already sufficient. This coating of a thickness of only a few μm or even less with a slide material layer of a soft metal such as Sn, Pb, In or a polymer such as for example polytetrafluor ethylene (PTFE) or lubricating varnish can provide this effect. When the soft slide material layer with good sliding properties is worn off, the motor oil assumes this task with the underlying hard material layer guaranteeing a good service life of the link chain.

For running-in of a link chain, the PVD coating with a material such as polytetrafluor ethylene (PTFE) has proven successful, which has excellent sliding properties but only a short service life. The invention is not limited to the materials mentioned above.

The invention has also been realized in a link chain having elements such as plates, pins, sleeves or rollers with at least one PVD coated pin being provided.

Also chains may be contemplated such as those disclosed in DE 203 04 437 U1 with the internal chain link having no hollow pin and/or sleeve. It is provided by a single widened internal plate. In such a chain, preferably the link pin and the outside of the internal plate receive a hard material layer by means of a PVD process.

Layers produced with the PVD process are particularly remarkable due to the fact that their surface roughness does not considerably deteriorate that of the coated surface. Especially CrN layers can easily be smoothed by finishing with mechanical methods.

Among the materials mentioned above, CrN has turned out to be favorable for use with link chains because it is durable, easily to be applied and induces a long link chain service life which is attributed to little layer thickness variations after application.

When the thin PVD coating is provided on the remaining surface of the pin joining the two plates and especially on its functional surfaces, the service life of the link chain according to the invention is even further improved. This is attributed to the fact that the surface of such pins particularly in the area of such functional surfaces frequently comes into contact with other areas of the chain drive. If during such a contact, wear is reduced, as is the case by the inventive provision of a hard material layer or in a combination with a slide material layer, the uniform chain pitch is maintained over an especially long operational life of the link chain delaying its failure even further beyond the operational life of the chain.

According to the invention, the hard surface coating can in that case be provided on the external surface of a hollow pin which is also designated as a sleeve or bushing according to the state of the art. Such hollow pins are used for connection of the internal plates of an internal chain link. A sleeve and/or hollow pin can be wound, sintered or extruded and subsequently be shot blasted as an option. Rollers are often still located on such hollow pins adapted to rotate on the hollow pin by forming a slide bearing surface. Such rollers are used especially when a roller chain is supposed to run on a gearwheel which reduces wear even further. The roller may be coated on its outside with a combination of a slide layer and a hard material which would then be gentle on or save the teeth of a driving means engaging into the chain.

Masking of the pins can be made such that after manufacture they are pressed into one dead hole each with their ends which is provided, for example, in a flexible, heat resistant material. It is also possible to put a magnetic plate on the object, for example, if the face of a pin or a sleeve is supposed to be masked. Subsequently the pins are PVD coated, removed and integrated into the link chain manufacturing process. Handling may be made by a robot or an automatic pick-and-place machine.

The invention has already been realized in a chain link which serves to manufacture a chain. Likewise the invention comprises a chain with such improved chain links.

It is the objective of the novel chain pairing to improve wear resistance without degrading service life, cost or other marginal conditions. The chain pin according to the invention is used in the following link-articulated chains such as for example sleeve type chains, inverted tooth type chains and leaf chains.

Instead of a common chain pairing with thermochemically heat treated pins and sleeves in the form of surface carbonitrided sleeves and chromised pins, elements are used having a hard material layer and/or slide material layer combination deposited by means of a PVD process. Thus problems are reduced which have resulted from constantly increasing requirements on the chain in the motor. Service life, which is limited by wear in the chain link, is increased.

Layer thickness can be varied as a function of the two parameters of time and temperature of the PVD process. For an optimum wear protection layer for link-articulated chains, a layer thickness of 1 μm to approx. 5 μm is aimed at, if necessary, also slightly above this value. In case of a layer thickness far beyond this value, it often happens that the hard material layer deposited by means of the PVD process chips off. With layer thicknesses below 1 μm the desired effect is generally not achieved.

Chain wear can be improved by up to 90% compared with State of the Art.

The invention provides a chain pin of link-articulated chains, which due to the employment of hard material layers deposited by means of a PVD process, exhibits a minimum of wear in the motor, since the hard material layers produced by this process minimize the coefficient of friction.

BRIEF DESCRIPTION OF THE DRAWINGS

The invention is illustrated more in detail in the figures below by means of an exemplary embodiment.

DETAILED DESCRIPTION

Figure 1:
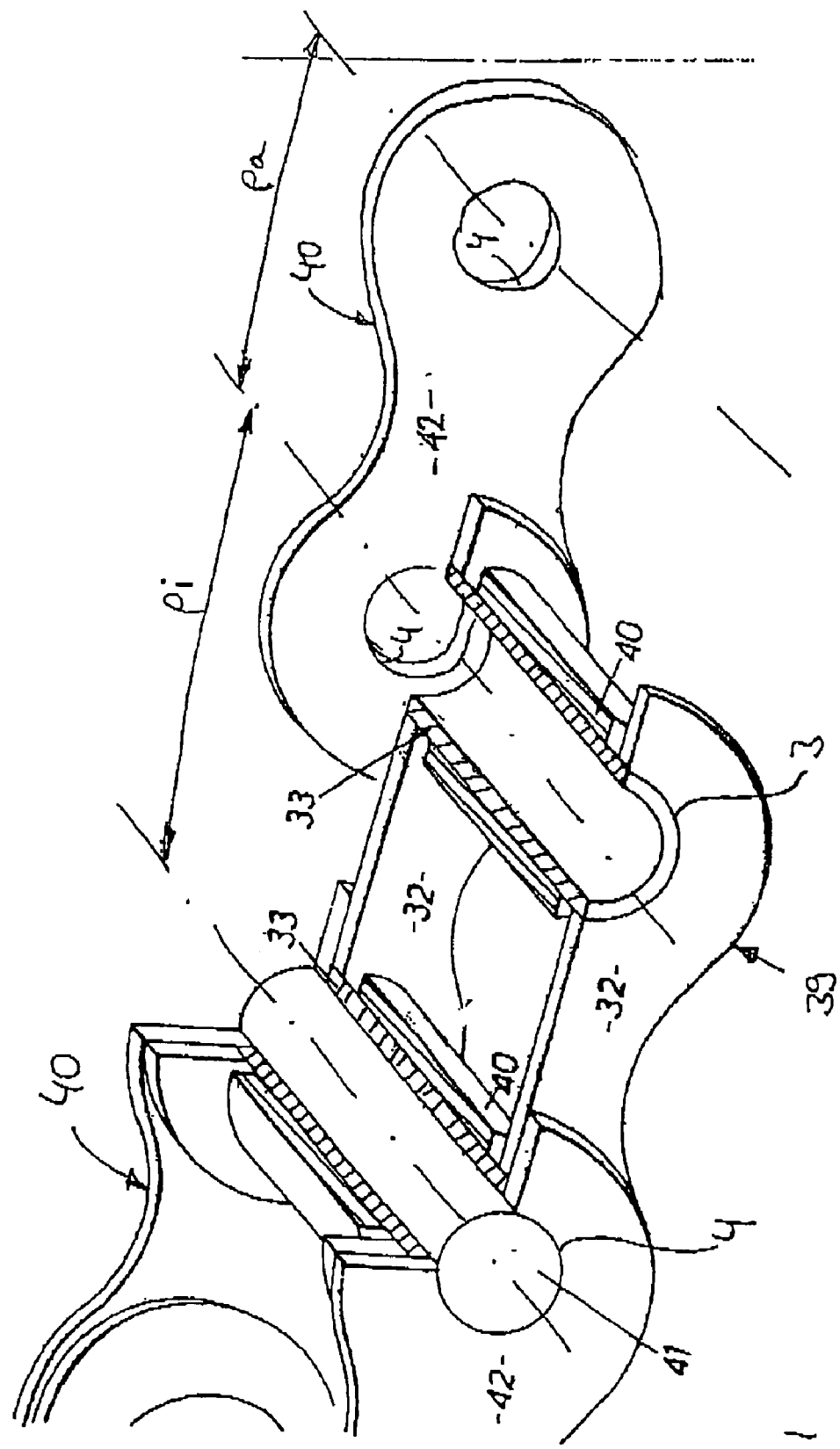
FIG. 1 shows a perspective and partly sectional view of a link chain according to the invention.

FIG. 1 is a perspective and partly sectional view of a link chain according to the invention.

The link chain 1 is divided into a number of internal chain links 39 which are connected to each other via a number of external chain links 40. Each internal chain link 39 has two internal plates 32 which are connected to each other via one sleeve 33 each, which is also called bushing or articulated sleeve. Sometimes, but not very often, the sleeve 33 is also called hollow pin. For connection, each internal plate 32 has two internal plate holes 3 into which the sleeve 33 is inserted with its edge portions by forming a press fit. The internal plate holes 3 are also called internal plate eye. On the outside of the sleeves 33, one roller 40 each is located, adapted to rotate on the sleeve 33.

In an alternative embodiment (not shown), no rollers 40 are located on the outside of the sleeves 33. In that case the sleeve 33 is sometimes called running sleeve, because it is running directly on the chain wheel.

The internal plates 32 are arranged mainly parallel to each other.

Two external plates 42 each and two chain link pins 41 each, arranged in external plate holes 4, connect two adjacent internal chain links 39. The external plate holes 4 are also called external plate eye. The chain link pin 41 is also called solid pin, rivet, chain rivet, stud bolt or hinge pin. Two external plates 42 each, with link pins 41 accommodated in the external plates, form an external chain link 40 each. The internal chain links 39 are also called internal plate chain links and the external chain links 40 are also called external plate chain links.

One link pin 41 each is located in one external plate hole 4 each by defining a press fit. The link pins 41 illustrated in FIG. 1 exhibit an entire hard material layer out of CrN with a layer thickness of approx. 2.5 µm which has been deposited by means of a PVD process.

For assembly of the link chain 1 reference is made to DE 198 36 374 C1, DE 1 752 557 AI and DE 100 33 726 C1. The invention may be realized with any assembly method.

During manufacture of the individual elements of the link chain 1 from FIG. 1 and during its assembly, care is taken that the internal pitch Pi, which results from the centre distance of symmetry axes of adjacent link pins 41 in an internal chain link 39, is as uniform as possible over the entire chain length. Likewise care is taken that the external pitch Pa, which results from the centre distance of symmetry axes of adjacent link pins 41 in an external chain link 40, is as uniform as possible over the entire chain length. To that extent reference is made to DE 203 05 741 01, which among others describes the correlation between internal pitch Pi, external pitch Pa and noise development.

Figure 2:
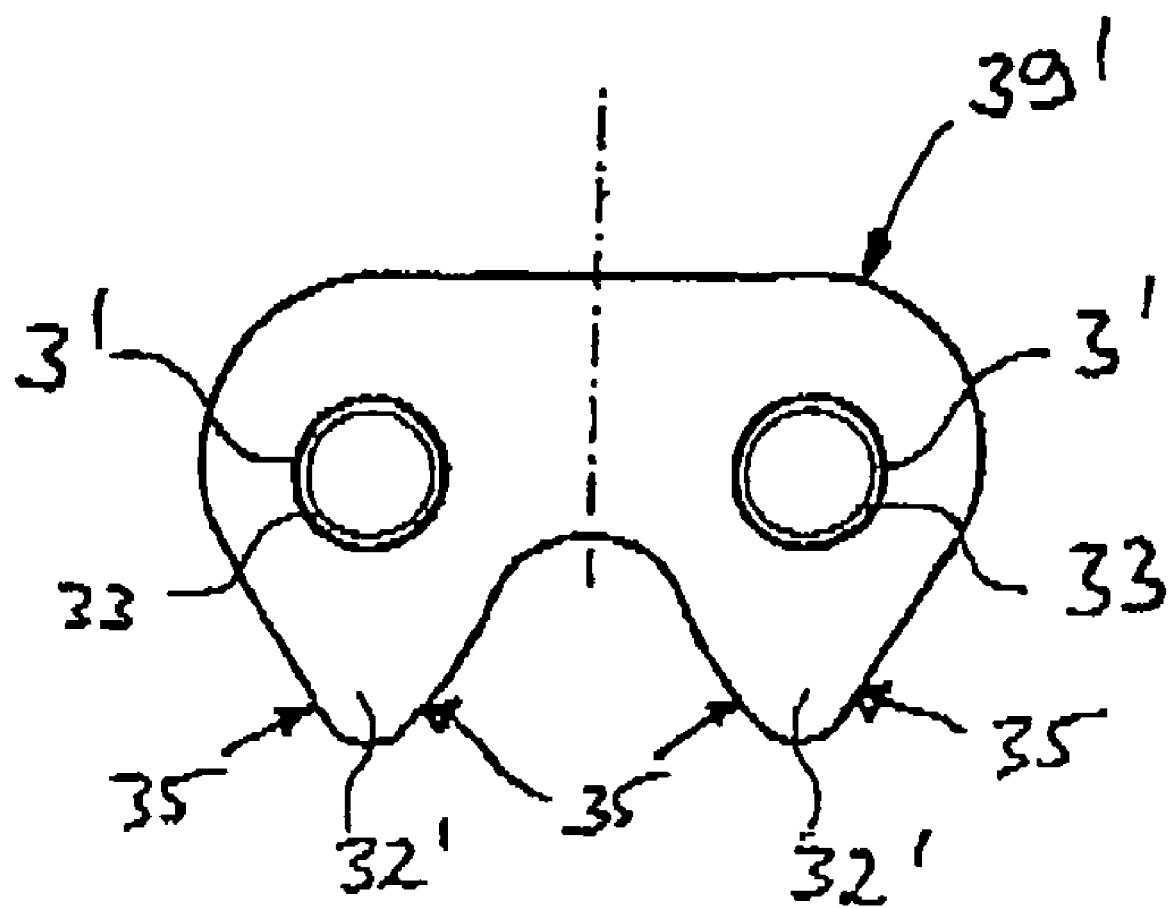
FIG. 2 shows a side view of an inverted tooth-type chain link according to the invention.

FIG. 2 is a side view of a chain link 39' which in major parts corresponds to the internal chain link 39 from FIG. 1. Same parts have the same reference numerals, equivalent parts are identified by a prime attached to the reference numeral.

The internal plates 32' are provided here with sprocket portions 35 projecting towards the bottom which engage into a gearwheel (not shown). The internal chain link 39', instead of the internal chain link 39, is assembled into a link chain together with the external chain links 40 from FIG. 1. A plate provided with a sprocket portion 35 is also called sprocket plate.

In another embodiment (not shown), the external plates 42 from FIG. 1 are provided with sprocket portions which correspond to the sprocket portions 35 of the internal chain link 39' from FIG. 2.

For application, manufacture and assembly reference is made to DE 203 04 437 U1.

Figure 3:
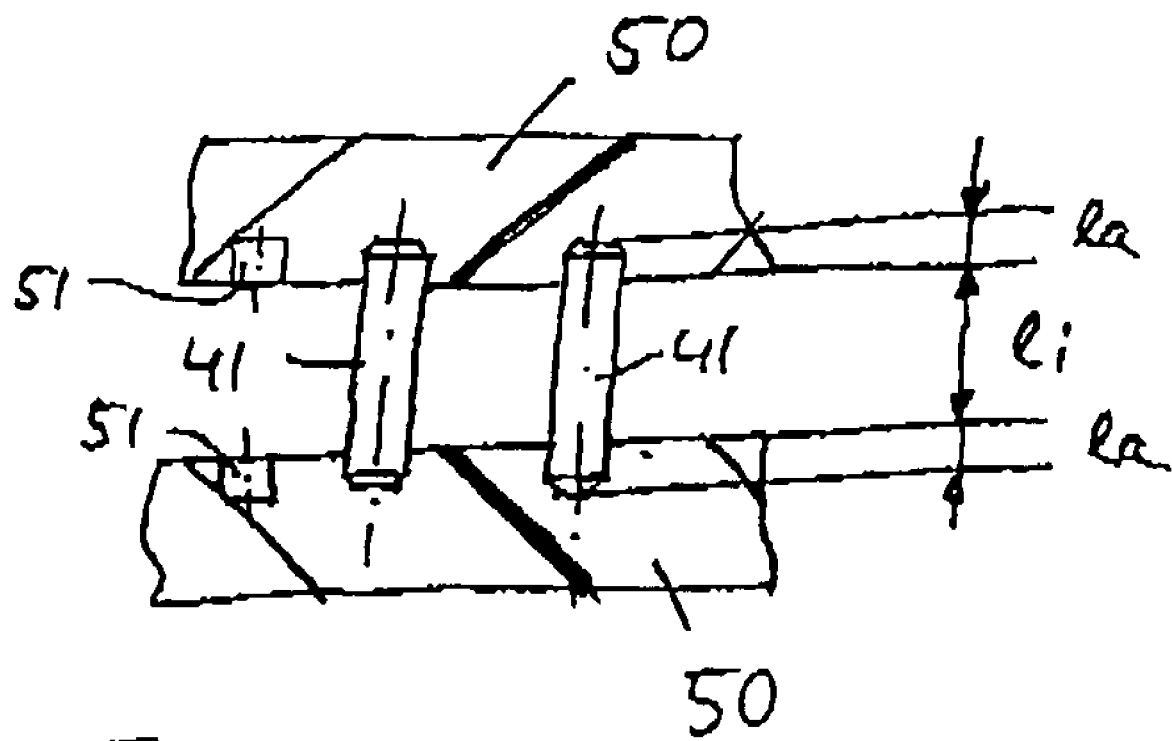
FIG. 3 shows a link pin according to the invention during PVC coating.

FIG. 3 illustrates how a coating is applied selectively in certain locations.

In a subsequent transition zone La between link pin 41 and external plate 42, no hard material coating is provided as an option. The manufacturing tolerances after production of the link pins 41 are maintained there despite a coating of the remaining surface areas li of the link pins 41 altering surface roughness and diameter. Detrimental preloads in the area of the plate hole 4 are thus avoided.

For masking of the link pins 41, after manufacture they are pressed into one dead hole 51 each with their ends which is provided in a masking holder 50 manufactured out of a flexible, heat resistant material such as for example PTFE. Subsequently the pins are coated by means of a PVD process in a PVD chamber (not shown) with a hard material layer out of CrN, removed and integrated into the link chain 1 production process. Layer thickness is controlled in this process via adjustment of coating time and coating temperature.

If a magnetic plate attachment (not shown) is provided for masking, masking of faces and transition zones is simplified. It is also possible to mask only one pin end and turn it after coating.

In this process, the basic material for the hard coating out of CrN is converted into the vapour phase in high-vacuum via the physical actions of vaporization (with arc, with ion beam or electron beam) or cathode sputtering and subsequently precipitated again on the unmasked link pins 41. The layer thickness produced on the unmasked link pins 41 in this process vary between 1 µm and approx. 5 µm.

Handling is done by a robot (not shown) or by an automatic pick-and-place machine.

LIST OF REFERENCE NUMERALS 1 link chain
3 internal plate hole
4 external plate hole
32 internal plate
33 sleeve
35 sprocket portion
39 internal chain link
40 roller and/or external chain link
41 link pin
42 external plate
50 masking holder
51 dead hole

We claim:

1. A link chain having a chain pin with a PVD applied coating of at least one portion of its surface comprising a hard material layer comprising a material selected from the group of materials consisting of AlN, AlON, CrN, CrCN, CrC, WC, WCN, TiN, TiBN, TiCN, TiC, TiAlN, ZrN, VC, cubic boron nitride and boron carbide, wherein face ends of the chain pin are exempt from the PVD applied coating.

2. The link chain according to claim 1, wherein the hard material layer has a thickness D equal to $1\ \mu m \leqq D \leqq 10\ \mu m$.

3. The link chain according to claim 1, wherein the hard material layer is placed onto the at least one portion of the chain pin surface as a basic layer and further comprising a slide material layer placed onto the basic layer.

4. The link chain according to claim 3, wherein the slide material layer has a thickness of d equal to $0.2\,\mu m \leqq d \leqq 20\,\mu m$.

5. The link chain according to claim 1, wherein the chain pin is selected from the group of a sleeve, a hollow pin, and a solid pin.

6. A link chain according to claim 1, wherein the coating is applied on an external surface area of the chain pin.

7. The link chain according to claim 3, wherein the slide material layer is applied as a coating and is selected from the group of materials consisting of Sn, Pb, In and alloys thereof.

8. The link chain according to claim 3, wherein the slide material layer is applied as a coating and comprises a polymer layer selected from the group of polymers consisting of polytetrafluoroethylene, polytetraflouroethylene derivatives, lubricating varnishes, and mixtures thereof.

9. The chain according to claim 1, wherein end portions of the chain pin are exempted from the PVD applied coating.

* * * * *